United States Patent [19]
Henthorne

[11] 3,958,212
[45] May 18, 1976

[54] POWER FAILURE WARNING SYSTEM
[75] Inventor: Henry H. Henthorne, Marysville, Calif.
[73] Assignee: The Raymond Lee Organization, Inc., New York, N.Y. ; a part interest
[22] Filed: Mar. 24, 1975
[21] Appl. No.: 561,363

[52] U.S. Cl. .................... 340/253 C; 340/248 B; 340/252 P
[51] Int. Cl.² ........................................ G08B 21/00
[58] Field of Search ........ 340/248 B, 253 R, 253 C, 340/252 P, 249

[56] References Cited
UNITED STATES PATENTS

| | | | |
|---|---|---|---|
| 2,112,137 | 3/1938 | Brach | 340/252 P |
| 2,731,629 | 1/1956 | Siderman | 340/252 P |
| 3,533,094 | 10/1970 | Brelje | 340/248 B |
| 3,859,646 | 1/1975 | Schwellenbach | 340/253 R |

FOREIGN PATENTS OR APPLICATIONS

| | | | |
|---|---|---|---|
| 359,050 | 10/1931 | United Kingdom | 340/253 C |

Primary Examiner—John W. Caldwell
Assistant Examiner—Daniel Myer
Attorney, Agent, or Firm—Daniel Jay Tick

[57] ABSTRACT

An electrical relay has an energizing winding and electrical relay contacts controlled in position by the winding. An energizing circuit electrically connects the energizing winding of the relay to one of the conductors of the power system at one of the conductors of an electrical appliance and to the other conductor of the appliance for maintaining the winding energized during operation of the power system and the appliance. A warning circuit electrically connects a source of electrical energy, a warning device and the relay contacts in circuit in a manner whereby when the power system is operating, the winding is energized, the contacts are separated and the warning device is inoperative. When the power system fails, the appliance is inoperative, the winding is deenergized, the contacts are moved into electrical contact and the warning device is operated by the source of electrical energy.

1 Claim, 3 Drawing Figures

U.S. Patent  May 18, 1976  3,958,212
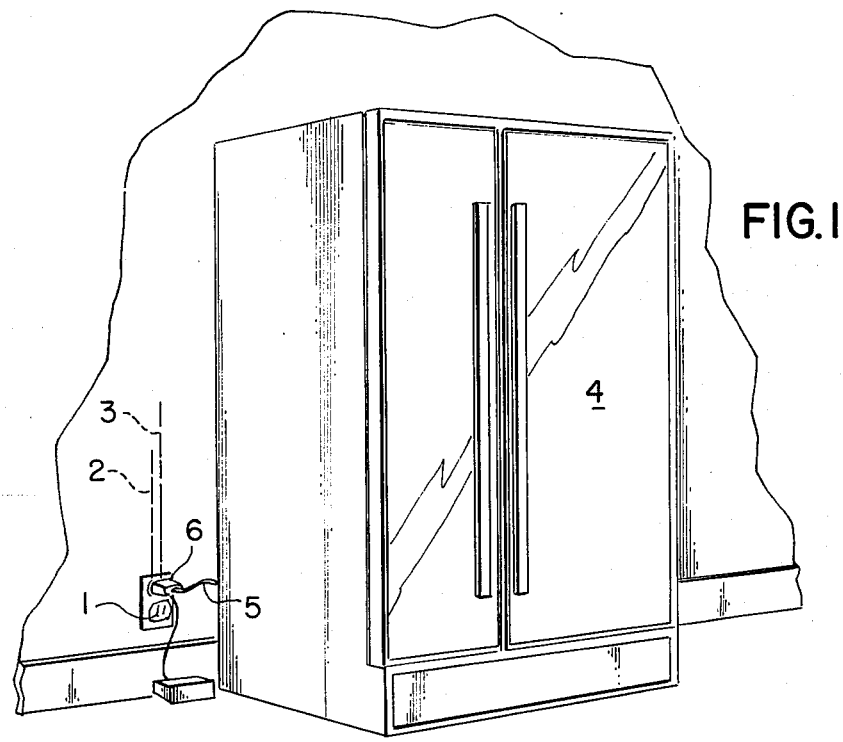
FIG.1
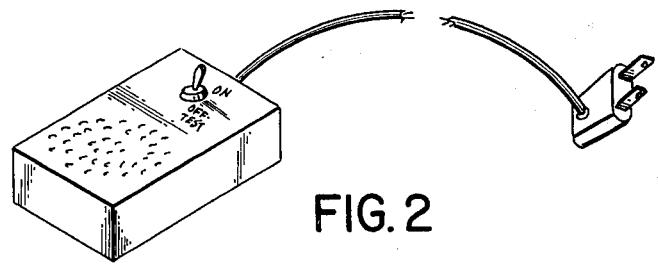
FIG.2
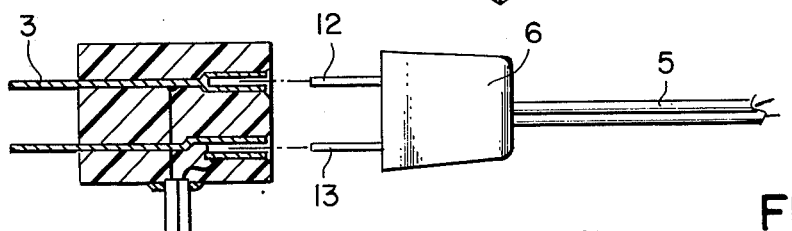
FIG.3
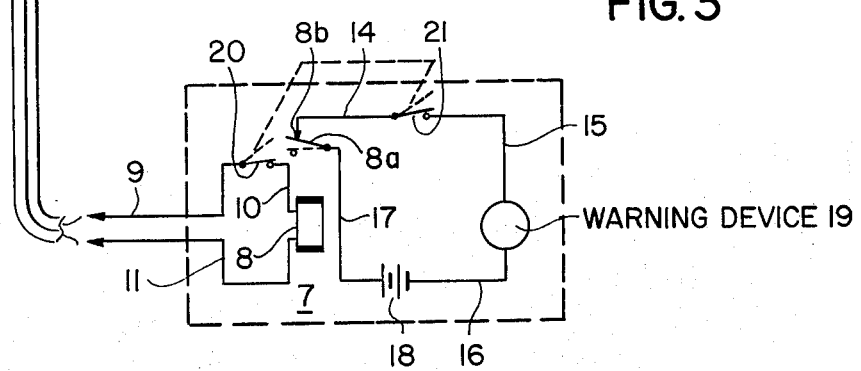

POWER FAILURE WARNING SYSTEM

DESCRIPTION OF THE INVENTION:

The present invention relates to a power failure warning system. More particularly, the invention relates to a power failure warning system for warning of the failure of power in a commercial power system.

Objects of the invention are to provide a power failure warning system of simple structure, which is inexpensive in manufacture, installable with facility and convenience, and functions efficiently, effectively and reliably to warn of power failure so that an electrical appliance which may suffer damage upon reinstitution of power may be attended to, and food from a freezer, refrigerator, or the like, may be saved.

In order that the invention may be readily carried into effect, it will now be described with reference to the accompanying drawing, wherein:

FIG. 1 is a perspective view of an embodiment of the power failure warning system of the invention;

FIG. 2 is a perspective view, on an enlarged scale, of the embodiment of FIG. 1; and FIG. 3 is a circuit diagram of an embodiment of the power failure warning system of the invention.

The power failure warning system of the invention warns of the failure of power in a commercial power system having a wall outlet 1 (FIG. 1) connected to two electrical conductors 2 and 3 of said system and energizing an electrical appliance 4 via said wall outlet. The appliance 4 has a pair of electrical conductors 5 (FIGS. 1 and 3) and a plug 6 connected thereto (FIGS. 1 and 3).

As shown in FIG. 3, the power failure warning system of the invention comprises an electrical relay 7 having an energizing winding 8, a relay armature 8a and a relay contact 8b. The relay armature 8a is controlled in position by the winding 8.

As shown in FIG. 3, an energizing circuit 9, 10, 11 electrically connects the energizing winding 8 of the relay 7 to the conductor 3 of the power system at one of the conductors 5 of the appliance 4 at the prong 12 of the plug 6 thereof and to the other conductor of the appliance via the prong 13 of said plug. The energizing circuit 9, 10, 11 maintains the winding 8 energized during operation of the power system and the appliance 4.

A warning circuit 14, 15, 16, 17 electrically connects a source of electrical energy 18 such as, for example, a battery of any suitable type, a warning device 19 of any suitable type which produces an audible and/or visible alarm, and the relay armature 8a and relay contact 8b in circuit. When the power system is operating, the winding 8 is energized, the armature 8a is separated from the contact 8b and the warning device 19 is inoperative. This is shown by solid lines of the relay armature 8a in FIG. 3. When the power system fails, the appliance 4 is inoperative, the winding 8 is deenergized, the relay armature 8a is moved into electrical contact with the relay contact 8b, as shown by broken lines, and the warning device 19 is operated by the source of electrical energy 18 and produces an audible and/or visible signal.

The switches 20 and 21 are connected in the energizing and warning circuits, respectively, for manually selectively activating and deactivating the warning system.

While the invention has been described by means of a specific example and in a specific embodiment, I do not wish to be limited thereto, for obvious modifications will occur to those skilled in the art without departing from the spirit and scope of the invention.

I claim:

1. A power failure warning system for warning of the failure of power in a commercial power system having a wall outlet connected to two electrical conductors of said system and energizing an electrical appliance via said wall outlet and a pair of electrical conductors of the appliance and a plug connected thereto, said warning system comprising a first housing of electrically insulative material having a pair of spaced substantially parallel electrical conductors extending therethrough, said conductors extending as prongs from one end of the first housing and having sockets provided thereat at the opposite end of the first housing, said prongs being insertable in a commercial power outlet and the plug of the appliance being insertable in the sockets of the first housing:

an electrical relay in a second housing having an energizing winding and electrical relay contacts controlled in position by said winding;

a source of electrical energy in the second housing;

a warning device in the second housing;

an energizing circuit electrically connecting the energizing winding of the relay to one of the conductors of the power system and one of the conductors of the appliance via the corresponding conductor of the first housing and to the other conductor of the appliance via the corresponding socket of the first housing for maintaining the winding energized during operation of the power system and the appliance;

a warning circuit in the second housing electrically connecting the source of electrical energy, the warning device and the relay contacts in circuit in a manner whereby when the power system is operating, the winding is energized, the contacts are separated and the warning device is inoperative, and when the power system fails, the appliance is inoperative, the winding is deenergized, the contacts are moved into electrical contact and the warning device is operated by the source of electrical energy; and switch means in the second housing connected in the energizing and warning circuits for manually selectively activating and deactivating the warning system.

* * * * *